United States Patent [19]

Telser et al.

[11] Patent Number: 5,061,606

[45] Date of Patent: Oct. 29, 1991

[54] PREPARATION OF RELIEF PRINTING PLATES

[75] Inventors: Thomas Telser, Schriesheim; Horst Koch, Gruenstadt; Karl-Rudolf Kurtz, Heidelberg; Helmut Bach, Mutterstadt; Heinz-Ulrich Werther, Wachenheim, all of Fed. Rep. of Germany

[73] Assignee: BASF Aktiengesellschaft, Fed. Rep. of Germany

[21] Appl. No.: 425,491

[22] Filed: Oct. 20, 1989

Related U.S. Application Data

[63] Continuation of Ser. No. 260,712, Oct. 21, 1988, abandoned.

[30] Foreign Application Priority Data

Mar. 10, 1988 [DE] Fed. Rep. of Germany ....... 3807929

[51] Int. Cl.$^5$ ............................ G03F 7/30; G03F 7/32
[52] U.S. Cl. .................................... 430/306; 430/309; 430/331; 430/325
[58] Field of Search ................ 430/309, 306, 331, 325

[56] References Cited

U.S. PATENT DOCUMENTS

| | | | |
|---|---|---|---|
| 2,768,863 | 8/1956 | Plambeck, Jr. ...................... | 430/306 |
| 2,891,849 | 6/1959 | Whitbourne ..................... | 430/306 X |
| 3,794,494 | 2/1974 | Kai et al. .......................... | 430/306 X |
| 3,887,373 | 6/1975 | Hays et al. ............................. | 96/49 |
| 4,294,908 | 10/1981 | Harita et al. ..................... | 522/159 X |

FOREIGN PATENT DOCUMENTS

1189944 4/1970 United Kingdom .

OTHER PUBLICATIONS

Grant, Julius, ed. *Hackh's Chemical Dictionary*, Third Edition, "Kerosene", p. 468, McGraw-Hill Book Company, Inc., N.Y., 1944.

Patent Abstracts of Japan, vol. 8, No. 278, Abst. of Appl. No. 58-18872 (8-21-84).

*Primary Examiner*—Cynthia Hamilton
*Attorney, Agent, or Firm*—Keil & Weinkauf

[57] ABSTRACT

The present invention relates to an improved process for preparing a photopolymerized flexographic relief printing plate or a photoresist from a photosensitive element comprising a photopolymerizable layer consisting essentially of above 45°

(A) at least one polymer as the binder,
(B) at least one photopolymerizable monomer compatible with said binder (A) and
(C) one photoinitiator, by
  (i) imagewise exposing said photopolymerizable layer of said element to actinic light and
  (ii) washing out the unexposed, non-photopolymerized parts of said layer with a developer, thereby obtaining a photopolymerized flexographic relief printing plate or a photoresist.

The improvement of said process comprises: washing out the non-photopolymerized parts of the irradiated photopolymerizable layer with the developer which consists essentially of at least one hydrogenated petroleum fraction having a flashpoint above 45° C. and a boiling range of from 160° to 220° C., 0 to 2% by weight, based on the developer, of at least one surface active compound and 0 to 10% by weight, based on the developer, of a monoterpene. In a preferred embodiment the improved process makes use of a developer which contains, in addition to the abovementioned components, 5 to 20 vol. %, based on the developer, of an alcohol selected from the group consisting of alcohols with 4 to 8 carbon atoms.

12 Claims, No Drawings

PREPARATION OF RELIEF PRINTING PLATES

This application is a continuation of application Ser. No. 260,712, filed on Oct. 21, 1988 now abandoned.

The present invention relates to a process for preparing relief printing plates crosslinked by photopolymerization, wherein certain developers are used for washing out the non-crosslinked parts of the layers.

The preparation of printing plates and photoresists, by imagewise exposure of photopolymerizable or photocrosslinkable relief-forming layers to actinic light, with crosslinking of the exposed parts of the layer, and subsequent washing out of the non-crosslinked parts of the layers in developers is known. The developers usually used are chlorohydrocarbons, e.g. trichloroethylene or tetrachloroethylene, aromatic hydrocarbons, such as benzene or toluene, saturated cyclic and acyclic hydrocarbons, such as hexane or cyclohexane, unsaturated cyclic hydrocarbons, e.g. terpenoid compounds, limonene, pinene, and lower aliphatic ketones, such as acetone or methyl ethyl ketone, if necessary as a mixture with an alcohol (for example butanol having a content of about 20% by volume).

The washout solution frequently used commercially for flexographic printing plates and photoresists, consisting of about 80 parts by volume of tetrachloroethylene and 20 parts by volume of n-butanol or trichloroethane, is toxic and therefore gives rise to problems during operation of the washout apparatuses. Thus, operation in conformity of the regulations requires venting, and the waste air must be freed from the chlorohydrocarbons before being released. Disposal of the washout solution used also presents problems. Other problems arise as a result of the pronounced swelling which the exposed layer undergoes during the washout process. The pronounced swelling of the layer causes damage to the photopolymerized structures (fragmentation, detachment of fine elements, etc.) and low resistance to overwashing.

Combustibility problems are encountered when alternative washout agents, such as the aromatic and aliphatic hydrocarbons, are used. These solvents have flashpoints below 21° C. and would therefore have to be used in explosionproof systems. This also applies to the low molecular weight solvents from the group consisting of the ketones.

Terpenoid hydrocarbons, e.g. limonene, have sufficiently high flashpoints; however, their use as a washout solution is restricted by their intense, frequently irritating odor.

It is an object of the present invention to provide a washout agent whose flashpoint is substantially above room temperature and which requires only a short washout time for printing plates and photoresists, causes only slight swelling of the printing plate and has low toxicity and only a slight or pleasant odor.

We have found that this object is achieved and that, surprisingly, these properties can be obtained with washout agents which contain certain hydrogenated petroleum fractions as hydrocarbon solvents.

The present invention relates to a process for preparing a relief printing plate, which is crosslinked by photopolymerization, by imagewise exposing a layer which can be crosslinked by photopolymerization to actinic light, with crosslinking of the exposed parts of the layer, and washing out the non-crosslinked parts of the layer with a hydrocarbon solvent or a mixture of a hydrocarbon solvent and an alcohol, wherein a hydrogenated petroleum fraction which has a flashpoint $>45°$ C. and a boiling range of from 160° to 220° C. is used as the hydrocarbon solvent.

The hydrogenated petroleum fractions generally have an aromatics content of $<1\%$, according to DIN (German Industrial Standard 51,378.) Preferred hydrogenated petroleum fractions are those which contain from 0.5 to 50%, likewise determined according to DIN 51,378, of naphthenic compounds.

The novel washout agents may also contain added odor improvers and/or surface active compounds.

Hydrocarbon solvents containing aromatics (aromatics content $>10\%$) are also suitable as washout agents for printing plates or resists but have substantially lower OEL values (OEL = occupational exposure limit) and an unpleasant odor.

On the other hand, purely paraffinic solvents, for example the synthetic isoparaffins, are hardly suitable for washing out printing plates and resists. The same applies to high boiling n-paraffin mixtures.

Because of excessively long washout times, dearomatized hydrocarbon solvents having a boiling range above 230° C. are also unsuitable as washout agents for printing plates or resists.

Hydrogenated petroleum fractions which are particularly preferred according to the invention are those which, in addition to an aromatics content of $<1\%$ and a flashpoint of $>45°$ C., have a boiling range of from 170° to 220° C., in particular from 180° to 210° C., and a content of naphthenic hydrocarbons of from 0.5 to 50%, in particular from 10 to 40% (according to DIN 51 378).

Examples of suitable hydrogenated petroleum fractions are Shellsol ®D 60 from Shell and Exxsol ®D 60 from Esso, which have a boiling range of about 180° to 210° C., a flashpoint of about 60° C. and an aromatics content of 0.5% and contain about 30% of naphthenic hydrocarbons. These products are also virtually completely odorless and have high OEL values. p Since flexographic printing plates generally have a multilayer structure (frequently a thin, about 5 $\mu$m thick top layer of polyamide is present on the relief layer, which is about 3,000 $\mu$m thick), it may be advantageous to add an alcohol component to the hydrogenated petroleum fractions to be used according to the invention.

Alcohols of 4 to 8 carbon atoms (e.g. n-butanol, n-pentanol, isobutanol, hexanol, etc.) have proven suitable for this purpose. In order to ensure that the top layer of polyamide is sufficiently soluble, the content of the alcohol component should be not less than 5, preferably 20% by volume. The presence of the alcohol lowers the flashpoint of the pure hydrocarbon solvent by 10°–20° C. The flashpoints of the formulated washout solutions are then about 40° C. The washout solutions can therefore be used in apparatuses which are not explosionproof.

As stated above, the washout solutions may also contain surface active compounds which accelerate dissolution of the unexposed material, and odor-improving substances.

Examples of suitable surface active compounds are alkyl-sulfonates and their salts, alkylammonium salts or oxyethylated fatty alcohols, fatty alchol ether sulfates and their salts and fatty alcohol phosphorus esters and their salts. The surface active compounds can usually be added to the washout solution in an amount of from 0 to 2% by weight.

Examples of suitable odor-improving additives are the naturally occurring terpenoid compounds, limonene, pinene, citronellol, etc. They can be added to the washout solution in an amount of from 0 to not more than 10% by weight, depending on the desired intensity of the aromatic odor.

Developing and washout of the imagewise exposed photopolymeric layers are carried out in a conventional manner in the known spray brush or friction washers at from 20° to 50° C. It was found that the washout time required for a certain washout depth is only insignificantly longer in the case of the novel washout solutions than in the case of the conventional washout agents, but that the solvent absorption of the exposed parts of the relief layer is dramatically reduced in the case of the novel washout solutions. This results in a very considerable improvement in the overwashing resistance of the structures produced by imagewise exposure, i.e. even if the washout time required for a certain relief height is exceeded, defect-free structures are obtained. This is important in particular for thin layers (thickness <0.7 mm), which are used in photoresists and increasingly also in high quality halftone flexographic printing.

The stability to fragmentation of the structures produced by imagewise exposer is also considerably improved by the use, according to the invention, of the hydrogenated petroleum fractions described above. This is particularly important in the case of thick, flexible and resilient printing plates which have a high relief (about 3 mm) and are used, for example, for printing cartons and corrugated board.

Another surprising advantage of the washout solutions to be used according to the invention relates to the surface quality of the imagewise exposed and washed out layers. Particularly when flexographic printing plates are washed out in the solvents conventionally used in flexographic printing, the result is frequently an undesirable surface structure in the form of wrinkles (orange peel), which is not observed when washout is effected in the novel solvents, so that the relief printing plates prepared according to the invention have a uniformly smooth surface.

Another surprising advantage of the washout solutions to be used according to the invention is the fact that, in spite of the high boiling range of the hydrogenated petroleum fractions under discussion in comparison with the washout solutions containing tetrachloroethylene, longer drying times are not required after the washout process.

Another advantage is that the washout agents according to the present invention can be used in washout apparatuses which are not explosion-proof. Because of the slight intrinsic odor of the hydrogenated petroleum fractions to be used according to the invention, venting of the washout apparatuses can be greatly reduced. After preparation, the relief printing plates are odorless.

A further advantage is the fact that the novel washout solutions can be successfully used on a large number of known layers which can be crosslinked by photopolymerization.

For example, short washout times are found in the case of photopolymerizable layers which contain vinylaromatic/alkadiene block copolymers (styrene-isoprene-styrene, styrene-butadiene-styrene, styrene-isoprene-styrene/butadiene, etc.) as binders, and in the case of layers which contain alkadiene/acrylonitrile-copolymers (butadiene-acrylonitrile), fluorine rubbers (vinylidene chloride-hexafluoropropylene copolymers), natural rubber, silicone polymers and polysulfide rubbers as binders. Short washout times are also found in the case of recording materials which contain ethylene-propylene-diene terpolymers as binders.

The examples and comparative examples which follow illustrate the advantages of the novel washout agents for flexographic printing plates.

The raw layers used had the following compositions (amounts in % by weight)

| 1. Plate type 1 (single-layer plate) | |
| --- | --- |
| 3-Block rubber of styrene/isoprene/styrene-butadiene according to EP-A-27 612, Example 2 | 87.592% |
| Liquid paraffin | 5% |
| Hexanediol diacrylate | 5% |
| Benzil dimethyl ketal | 1.2% |
| 2,6-di-tert-butyl-p-cresol | 1.2% |
| Solvent Black (C.I. 26,150) dye | 0.008% |

2,700 μm thick layer on 125 μm thick polyethylene terephthalate film which was coated with a polyurethane adhesion promoter.

| 2. Plate type 2 (multilayer plate) | |
| --- | --- |
| 3-block rubber as for plate type 1 | 93.596% |
| Hexanediol diacrylate | 5% |
| Benzil dimethyl ketal | 0.4% |
| 2,6-di-tert-butyl-p-cresol | 1.0% |
| Solvent Black (C.I. 26,150) dye | 0.004% |

700 μm thick layer on 125 μm thick polyethylene terephthalate film which had been coated with a polyurethane adhesion promoter. The base used was a photo-crosslinkable layer which was likewise based on an elastomeric binder (thickness 2,000 μm).

| 3. Plate type 3 | |
| --- | --- |
| Terpolymer of ethylene/propylene/ethylidenenorbornene (containing 50% of ethylene and 8 double bonds per 1,000 carbon atoms) | 78% |
| Dioctyl adipate | 10% |
| Dihydrocyclopentadienyl acrylate | 6% |
| Isobornyl acrylate | 4% |
| Benzil dimethyl ketal | 2% |

2,700 μm thick layer on 125 μm thick polyethylene terephthalate film which was coated with a polyurethane adhesion promoter.

EXAMPLE 1

A flexographic printing plate (plate type 1) was prepared in a conventional manner.

The flexographic printing plate was first preexposed uniformly for 65 seconds from the back in a tube exposure unit, and subjected to stepwise imagewise exposure through a photographic negative (exposure times per copy of the negative from 6 to 20 minutes) and washed out at room temperature in a brush washer which was not explosion-proof and had a low air venting rate (about 10 m³/h). The washer contained a washout solution consisting of 80 parts by volume of a hydrogenated petroleum fraction (naphthene content 35%, boiling range 186°–217° C.) and 20 parts by volume of n-butanol.

For a desired relief height of 700 μm, the optimum washout time was 6 minutes.

After an exposure time of only 6 minutes, all test elements of the resulting flexographic printing plate have been completely and correctly formed.

The flexographic printing plate was dried for 2 hours at 65° C., stored for 15 hours at room temperature, subjected to a conventional aftertreatment with an aqueous bromine solution and dried again.

After preparation, the printing plate had a uniformly smooth surface and was odorless, and no orange peel was observed.

The aftertreated flexographic printing plate was clamped on a printing cylinder in a flexographic printing unit and gave excellent printed copies which showed no information loss at all compared with the photographic negative.

EXAMPLE 2

The procedure was similar to that in Example 1, except that the alcohol component added to the washout solution was n-pentanol 20 parts by volume) instead of n-butanol. The washout tests were once again carried out in a brush washer which was not explosion-proof and had a low venting rate (about 10 m$^3$/hour).

The optimum washout time was 6 minutes. All test elements had been completely and correctly formed after an exposure time of only 6 minutes.

Following the aftertreatment, this printing plate too had a uniformly smooth su-face and good printing properties and was odorless.

COMPARATIVE EXAMPLE 1

The procedure was similar to that in Example 1, except that the washout solution used was a mixture of 80 parts by volume of tetrachloroethylene and 20 parts by volume of n-butanol.

The washout tests were carried out in a brush washer which was not explosion-proof but had a high air venting rate (about 100 m$^3$/h).

The optimum washout time was 5 minutes. The test elements were correctly formed only after an exposure time of >12 minutes. With shorter exposure times, fragmentation was observed in the test elements, in particular in screen elements and dots.

After drying and aftertreatment, the printing plates had a nonuniform structured surface (orange peel).

COMPARATIVE EXAMPLE 2

The procedure was similar to that in Example 1, except that the washout solution used was a mixture of 80 parts by volume of mineral spirit (aromatics content 25%, boiling range 187°–216° C.) and 20 parts by volume of n-butanol. The washout tests were carried out in a washer which was explosion-proof and had a high venting rate (about 100 m$^3$/h).

The optimum washout time was 5 minutes. After their preparation, the printing plates had an unpleasant odor.

COMPARATIVE EXAMPLE 3

The procedure was similar to that in Example 1, except that the washout solution used was a mixture of 80 parts by volume of mineral spirit (aromatics content 25%, boiling range 155°–185° C.) and 20 parts by volume of n-butanol The tests were carried out in a washer which was explosion-proof and had a high venting rate (about 100 m$^3$/h).

The optimum washout time for a 700 μm relief was 6 minutes. After their preparation, the printing plates had an unpleasant odor.

COMPARATIVE EXAMPLE 4

The procedure was similar to that in Example 1, except that the washout agent used was a mixture of 80 parts by volume of a hydrogenated mineral oil (boiling range 220°–255° C., content of naphthenic compounds about 30%) and 20 parts by volume of n-butanol. The tests were carried out in a brush washer which was not explosion-proof and had a low venting rate (about 10 m$^3$/h)

The washout time for a 700 μm high relief was 17 minutes.

EXAMPLE 3

The procedure was similar to that in Example 2, except that, instead of plate type 1, the multilayer plate type 2 having a fixed relief height of 700 μm was used. The tests were carried out in a washer which was not explosion-proof and had a low venting rate (about 10 m$^3$/h).

The optimum washout time was 6 minutes. With 100% overwashing, i.e. with a total washout time of 12 minutes, no damage to the relief structure or lacking test elements could be observed. The printing plates were odorless.

COMPARATIVE EXAMPLE 5

The procedure was similar to that in Example 3, except that in this case a washout solution consisting of 80 parts by volume of tetrachloroethylene and 20 parts by volume of n-butanol was used. The tests were carried out in a washer which was not explosion-proof and had a high venting rate (about 100 m$^3$/h).

The optimum washout time was 5 minutes. 100% overwashing was evident in this case from the lack of critical test elements (isolated dots and lines) and from fragmentation of half-tone area and screen elements.

EXAMPLE 4

For a plate of type 1 prepared as in Example 1, drying was determined as a function of time in an air-circulation drier at 65° C.

Directly after the washout process, the increase in weight due to swelling was 2%. After a drying time of 2 hours at 65° C., this figure had decreased to −0.1%, based on the initial weight. The extracted portion determined after a drying time of 24 hours was 0.3%, based on the initial weight.

COMPARATIVE EXAMPLE 6

The procedure was similar to that in Example 4, except that the washout solvent used was a mixture of 80 parts by volume of tetrachloroethylene and 20 parts by volume of n-butanol.

Directly after the washout process, the increase in weight due to swelling was 8%. After a drying time of 2 hours, this figure had likewise decreased to −0.1%, but the extracted portion was 1.7%, based on the initial weight.

EXAMPLE 5

The flexographic printing plate used was plate type 3. After preexposure from the rear, the printing plate was exposed imagewise from the front for 20 minutes through a test negative and then developed in a brush washer to give the plate. The washout solution used was a mixture of 80 parts by volume of a hydrogenated mineral oil fraction (naphthene content 35%, paraffin content 65%, boiling range 186°–217° C., aromatics content <1% according to DIN 51,378) and 20 parts by volume of n-butanol.

The optimum washout time for a relief height of 700 μm was 12 minutes. All test elements were satisfactorily and correctly formed. Aftertreatment gave plates which had a uniformly smooth surface.

COMPARATIVE EXAMPLE 7

The procedure was similar to that in Example 5, except that the washout agent used was a mixture of 80 parts by volume of tetrachloroethylene and 20 parts by volume of n-butanol.

The optimum washout time for a relief height of 700 μm was once again 12 minutes. Fragmentation was observed at edges and in dots. The aftertreatment gave plates which had a nonuniform surface which has been destroyed.

EXAMPLE 6

The procedure was similar to that, in Example 1, except that the washout solution used was a mixture of 75 parts by volume of hydrogenated petroleum fraction (boiling range 160°–195° C., naphthene content 35%), 20 parts by volume of n-butanol and 5 parts by volume of limonene.

The washout tests were carried out in a brush washer which was not explosion-proof and had a low venting rate (about 10 m³/h). The optimum washout time for a 700 μm relief was 5 minutes. The plates had a pleasant orange-like odor.

We claim:

1. An improved process for preparing a photopolymerized flexographic relief printing plate from a photosensitive element comprising a photopolymerizable layer consisting essentially of
   (A) at least one polymer selected from the group consisting of vinylaromatic/alkadiene block copolymers, alkadiene/acrylonitrile copolymers, fluorine rubbers, natural rubber, silicone polymers, polysulfide rubbers, and ethylene-propylene-diene terpolymers, as the binders,
   (b) at least one photopolymerizable monomer compatible with said binder (A) and
   (C) at least one photoinitiator, by
       (i) imagewise exposing said photopolymerizable layer of said element to actinic light and
       (ii) washing out the unexposed, non-photopolymerized parts of said layer with a developer, thereby obtaining a photopolymerized flexographic relief printing plate,
   the improvement comprising: washing out the non-photopolymerized parts of the irradiated photopolymerizable layer with a developer consisting essentially of at least one hydrogenated petroleum fraction having a flashpoint above 45° C. and a boiling range of from 160° to 220° C., 0 to 20% by weight, based on the developer, of at least one surface active compound, 0 to 10% by weight, based on the developer, of at least one monoterpene and 5 to 20% by volume, based on the developer, of at least one alcohol selected from the group consisting of alcohols with 4 to 8 carbon atoms.

2. An improved process for developing a photopolymerized flexographic relief printing plate, said plate having been formed from a photosensitive element comprising a photopolymerizable layer of
   (A) at least one polymer selected from the group consisting of vinylaromatic/alkadiene block copolymers, alkadiene/acrylonitrile copolymers, fluorine rubbers, natural rubber, silicone polymers, polysulfide rubbers, and ethylene-propylene-diene terpolymers, as binder,
   (B) at least one photopolymerizable monomer compatible with said binder (A) and
   (C) at least one photoinitiator, by
       (i) imagewise exposing said photopolymerizable layer of said element to actinic light radiation and
       (ii) washing out the unexposed, non-photopolymerized parts of said layer with a developer, thereby obtaining a photopolymerized flexographic relief printing plate,
   the improvement comprising: washing out the non-photopolymerized parts of the irradiated photopolymerizable layer with a developer containing an amount of at least one hydrogenated petroleum fraction having a flashpoint about 45° C. and a boiling range of from 160° to 220° C. effective to wash out the non-polymerized parts of said photopolymerizable layer.

3. The improved process of claim 2, wherein said developer contains up to 10% by weight, based on the developer, of at least one monoterpene.

4. The improved process of claim 2, wherein said developer contains up to 20% by weight, based on the developer, of at least one surface active compound.

5. The improved process of claim 2, wherein said developer contains up to 5 to 20% by weight, based on the developer, of at least one alcohol selected from the group consisting of alcohols with 4 to 8 carbon atoms.

6. The improved process of claim 2, wherein said developer contains up to 10% by weight, based on the developer, of at least one monoterpene, up to 20% by weight, based on the developer, of at least one surface active compound and up to 5 to 20% by weight, based on the developer, of at least one alcohol selected from the group consisting of alcohols with 4 to 8 carbon atoms.

7. The improved process of claim 6, wherein the alcohol is selected from the group consisting of n-butanol, n-pentanol, iso-butanol and hexanol.

8. The improved process of claim 7, wherein said alcohol is n-pentanol.

9. The improved process of claim 6, wherein the monoterpene is limonene.

10. The improved process of claim 5, wherein the alcohol is selected from the group consisting of n-butanol, n-pentanol, iso-butanol and hexanol.

11. The improved process of claim 10, wherein the alcohol is n-pentanol.

12. The improved process of claim 3, wherein the monoterpene is limonene.

* * * * *

UNITED STATES PATENT AND TRADEMARK OFFICE
CERTIFICATE OF CORRECTION

PATENT NO. : 5,061,606

DATED : October 29, 1991

INVENTOR(S) : Thomas TELSER et al.

It is certified that error appears in the above-identified patent and that said Letters Patent is hereby corrected as shown below:

Column 8, Line 28, Claim 2

That part reading "flashpoint about 45" should read --flashpoint above 45--

Signed and Sealed this

Twenty-first Day of September, 1993

Attest:

BRUCE LEHMAN

Attesting Officer     Commissioner of Patents and Trademarks